United States Patent
Kamizuma et al.

(10) Patent No.: US 12,512,385 B2
(45) Date of Patent: Dec. 30, 2025

(54) POWER CONVERSION APPARATUS (71) Applicant: Hitachi, Ltd., Tokyo (JP)

(72) Inventors: Hiroshi Kamizuma, Tokyo (JP); Hangxian Gao, Tokyo (JP); Tetsuya Kawashima, Tokyo (JP); Masahiro Seo, Tokyo (JP)

(73) Assignee: HITACHI, LTD., Tokyo (JP)

(*) Notice: Subject to any disclaimer, the term of this patent is extended or adjusted under 35 U.S.C. 154(b) by 378 days.

(21) Appl. No.: 18/364,530

(22) Filed: Aug. 3, 2023

(65) Prior Publication Data
US 2024/0105543 A1 Mar. 28, 2024

(30) Foreign Application Priority Data

Sep. 26, 2022 (JP) .................. 2022-152264

(51) Int. Cl.
H01L 23/373 (2006.01)
H01L 23/31 (2006.01)
H01L 23/473 (2006.01)
H02M 7/00 (2006.01)
H05K 7/14 (2006.01)
H05K 7/20 (2006.01)

(52) U.S. Cl.
CPC ...... H01L 23/3735 (2013.01); H01L 23/3107 (2013.01); H01L 23/473 (2013.01); H02M 7/003 (2013.01); H05K 7/14322 (2022.08); H05K 7/20927 (2013.01)

(58) Field of Classification Search
CPC ............. H01L 23/3735; H01L 23/3107; H01L 23/473; H01L 23/34; H01L 23/4012; H02M 7/003; H02M 3/003; H02M 1/32; H02M 7/5387; H05K 7/14322; H05K 7/20927
See application file for complete search history.

(56) References Cited

U.S. PATENT DOCUMENTS

| | | | |
|---|---|---|---|
| 2009/0231811 A1* | 9/2009 | Tokuyama ............ | H02M 7/537 361/699 |
| 2013/0308269 A1* | 11/2013 | Rozman ................ | H01L 23/467 361/709 |
| 2014/0252590 A1* | 9/2014 | Gohara ................. | H01L 23/473 257/715 |

(Continued)

FOREIGN PATENT DOCUMENTS

WO 2020/003423 A1 1/2020

*Primary Examiner* — S M Sohel Imtiaz
(74) *Attorney, Agent, or Firm* — Volpe Koenig (57) ABSTRACT

There is provided a power conversion apparatus including a first power semiconductor module, a second power semiconductor module, a control circuit for driving the first power semiconductor module and the second power semiconductor module, and liquid-cooling type cooling jackets, wherein the second power semiconductor module is disposed closer to an upper surface in the gravity direction than the first power semiconductor module is, the cooling jackets include a refrigerant containing hydrogen molecules and a refrigerant flow path at least between the first power semiconductor module and the second power semiconductor module, and the control circuit performs control such that the operating time period of the second power semiconductor module is shorter than the operating time period of the first power semiconductor module.

8 Claims, 7 Drawing Sheets

(56) References Cited

U.S. PATENT DOCUMENTS

| | | | |
|---|---|---|---|
| 2020/0274357 A1* | 8/2020 | Inoue | H02J 3/16 |
| 2021/0114751 A1* | 4/2021 | Miyamoto | H01L 23/4006 |
| 2022/0033984 A1* | 2/2022 | Light | B01D 53/28 |
| 2023/0156980 A1* | 5/2023 | Kitagawa | H02M 7/003 |
| | | | 361/699 |

* cited by examiner

POWER CONVERSION APPARATUS

CROSS-REFERENCE TO RELATED APPLICATION

This application claims priority to Japanese Patent Application No. 2022-152264, filed on Sep. 26, 2022, the entire contents of which are incorporated by reference herein.

BACKGROUND OF THE INVENTION

1. Field of the Invention

The present invention relates to power conversion apparatuses, and particularly relates to technologies for improving the reliabilities of power conversion apparatuses adaptable to high altitudes.

2. Description of the Related Art

In recent years, attention has been focused on high-reliability power conversion apparatuses applicable to electric aircrafts and e-VTOLs, for realizing air mobilities as new transportation means for seamlessly transporting people and things in decarbonizing ways. At a high altitude, there is a larger dose of cosmic rays, and a power semiconductor device may be accidentally failed due to cosmic rays. Therefore, in order to adapt a power conversion apparatus to a high altitude, it is necessary to improve the tolerance of such a power semiconductor device to cosmic rays (particularly, neutron rays).

As means for improving the cosmic ray tolerance, there are two means: (1) increasing the withstand voltage of the device, and (2) intercepting cosmic rays through metal/concrete.

The means of (1) is based on the fact that if the withstand voltage of a device is increased, this makes this device less likely to be failed in general, thereby improving the cosmic ray tolerance thereof.

As a technique relating to cosmic ray interception of (2), for example, Patent Document 1 can be cited. WO 2020/003423A1 describes, in FIG. 33 and a paragraph 0104, that "A power supply apparatus 104 disposed in a spacecraft is exposed to radiation. When a chassis 10 for installing an electric component 25 thereon has a wall thickness of 2 mm or more, the chassis 10 can weaken the penetration of radiation such as α rays, γ rays, electron rays, and neutron rays therethrough".

SUMMARY OF THE INVENTION

However, if the withstand voltage of the device is increased as in (1), this increases the internal resistance of the device along with the increase of the withstand voltage, thereby increasing the loss and the volume of a cooling unit.

Furthermore, in the case of intercepting cosmic rays as in (2), the housing of the converter is required to have a sufficient thickness in order to enhance the effect of intercepting cosmic rays as in Patent Document 1, for example, which increases the weight. Therefore, there is a need for a methodology capable of achieving both reduction of the weight and improvement of the reliability.

A problem to be solved by the present invention is to provide a power conversion apparatus having improved cosmic ray tolerance while being suppressed from having increased weight and volume.

In order to solve the aforementioned problem, a power conversion apparatus according to the present invention includes, for example, a first power semiconductor module, a second power semiconductor module, a control circuit adapted to drive the first power semiconductor module and the second power semiconductor module, and a liquid-cooling type cooling jacket, wherein the second power semiconductor module is disposed closer to an upper surface in a gravity direction than the first power semiconductor module, the cooling jacket includes a refrigerant containing hydrogen molecules and a flow path for the refrigerant at least between the first power semiconductor module and the second power semiconductor module, and the control circuit performs control such that an operating time period of the second power semiconductor module is shorter than an operating time period of the first power semiconductor module.

According to the present invention, it is possible to intercept cosmic rays (neutron rays) by the refrigerant containing hydrogen molecules, and also it is possible to reduce the rate of failures of the entire power conversion apparatus by shortening the operating time period of the power semiconductor module disposed near the upper surface where cosmic rays are less intercepted. This can realize a power conversion apparatus having improved cosmic ray tolerance while being suppressed from having increased weight and volume.

DESCRIPTION OF THE PREFERRED EMBODIMENTS

Hereinafter, examples of the present invention will be described with reference to the drawings. In the respective drawings and the respective examples, the same or similar components will be denoted by the same reference numerals, and redundant description will be omitted.

First Example

Figure 1:
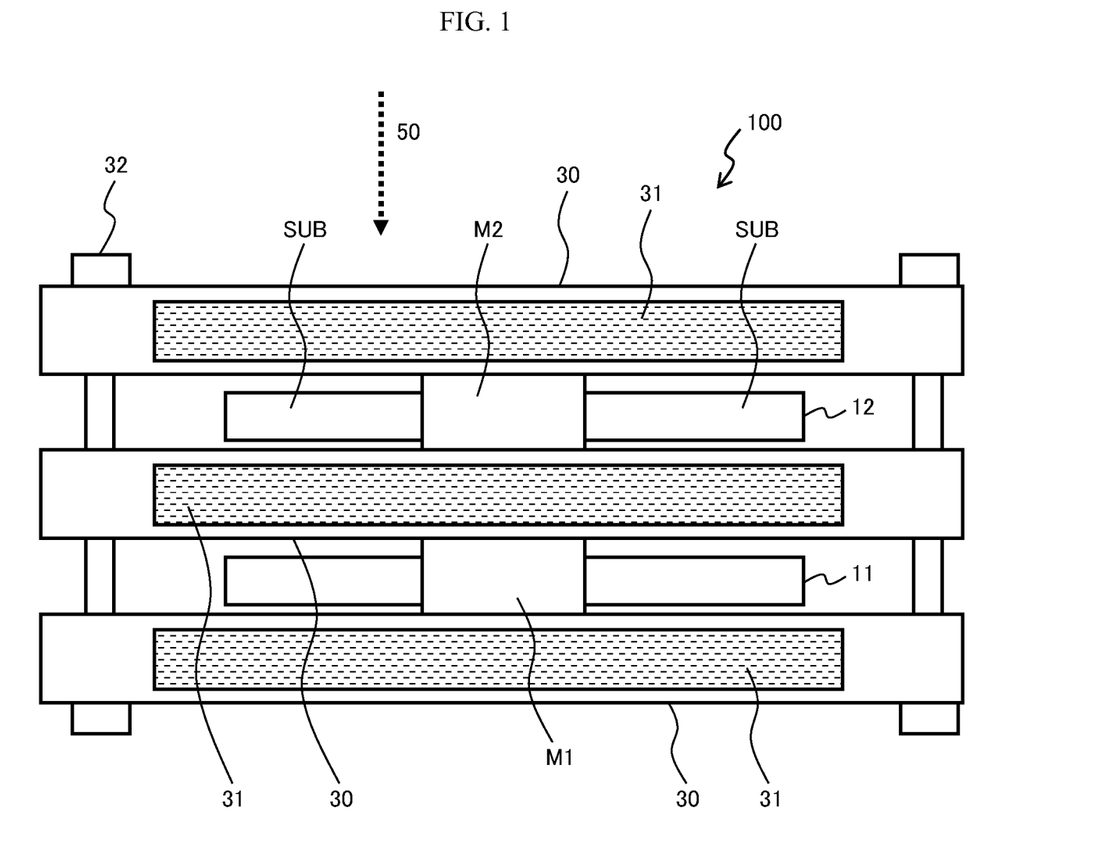
FIG. 1 is a cross-sectional view of a power conversion apparatus according to a first example.

FIG. 1 is a cross-sectional view of a power conversion apparatus according to a first example.

The power conversion apparatus 100 according to the first example includes a first power semiconductor module M1, a second power semiconductor module M2, a control circuit for driving the first power semiconductor module M1 and the second power semiconductor module M2, which is not illustrated, and liquid-cooling type cooling jackets 30.

The second power semiconductor module M2 is disposed closer to an upper surface than the first power semiconductor module M1, in the gravity direction 50.

The cooling jackets 30 include a refrigerant containing hydrogen molecules and include a refrigerant flow path 31 at least between the first power semiconductor module M1 and the second power semiconductor module M2. As the refrigerant containing hydrogen molecules, for example, a refrigerant containing water molecules can be used. Hydrogen molecules are highly effective at reducing cosmic rays (particularly neutron rays). Further, cosmic rays are directed mainly along the gravity direction 50. Accordingly, the first power semiconductor module M1 may be irradiated with a smaller dose of cosmic rays than that the second power semiconductor module M2 may be irradiated with.

Incidentally, the rate of failures caused by cosmic rays increases in proportion to the electric field intensity applied to the inside of the power semiconductor device, the operating time period, and the cosmic ray intensity. Therefore, under the same operating conditions, the second power semiconductor module M2 disposed near the upper surface experiences a higher cosmic ray intensity and is more likely to fail, since cosmic rays directed to the second power semiconductor module M2 are less intercepted.

For coping therewith, the control circuit in the power conversion apparatus 100 in the first example performs control such that the operating time period of the second power semiconductor module M2 is shorter than the operating time period of the first power semiconductor module M1. This can reduce the rate of failures of the second power semiconductor module M2, thereby reducing the rate of failures of the entire power conversion apparatus. This makes it possible to improve the cosmic ray tolerance while suppressing the increases of the weight and the volume.

Further, it is desirable that the cooling jackets 30 also have a refrigerant flow path 31 near the upper surface of the second power semiconductor module M2, as illustrated in FIG. 1. This can further reduce the dose of cosmic rays directed thereto, and also enables cooling the second power semiconductor module M2 at its both surfaces, thereby improving the reliability.

Further, it is desirable that the cooling jackets 30 also have a refrigerant flow path 31 near the lower surface of the first power semiconductor module M1, as illustrated in FIG. 1. This can cool the first power semiconductor module M1 at its both surfaces, thereby improving the reliability.

The first power semiconductor module M1 constitutes a power conversion unit 11 in combination with a circuit board SUB. Similarly, the second power semiconductor module M2 constitutes a power conversion unit 12 in combination with a circuit board SUB. Further, the plurality of the cooling jackets 30 is fixed by, for example, a fixing member 32 in a state of being stacked with the power conversion unit 11 and the power conversion unit 12 sandwiched therebetween.

Figure 2:
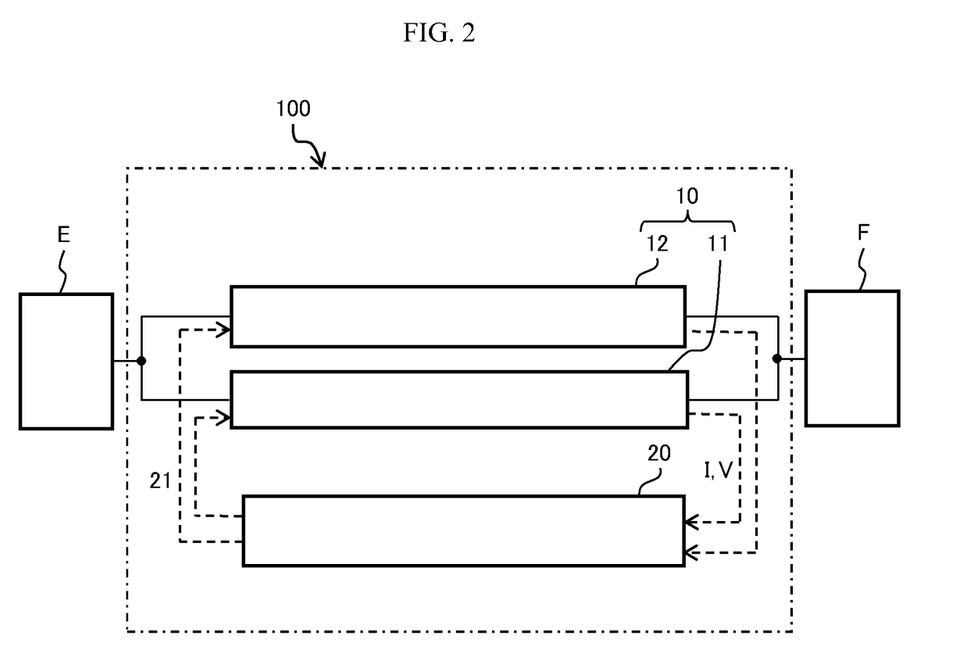
FIG. 2 is a functional block diagram of a power conversion apparatus according to the first example.

FIG. 2 is a functional block diagram of a power conversion apparatus according to the first example.

The power conversion apparatus 100 includes a power conversion unit 10 including the plurality of the power conversion units 11 and 12 connected in parallel to each other, and a parallel unit control circuit 20 for controlling the power conversion unit 10. In the first example, there will be described a three-phase inverter for converting DC power inputted from a DC power supply E into three-phase AC power and for outputting the three-phase AC power to a load F, as an example of the power conversion apparatus 100. However, the present invention is not limited thereto, and can be also applied to other types of power conversion apparatuses such as a single-phase inverter, a converter, and a DC-DC converter.

The parallel unit control circuit 20 includes electronic circuits such as a central processing unit (CPU), a read only memory (ROM), a random access memory (RAM), and various interfaces, for example. Further, the parallel unit control circuit 20 reads a program stored in the ROM and develops it in the RAM, and causes the CPU to execute various processes.

The parallel unit control circuit 20 has functions as follows. That is, the parallel unit control circuit 20 receives inputs of detected values of currents I and a voltage V, which are detected by various sensors installed in the power conversion units 11 and 12. Further, based on these detected values, the parallel unit control circuit 20 outputs predetermined control signals 21 to the power conversion units 11 and 12 for controlling the power conversion units 11 and 12.

Figure 3:
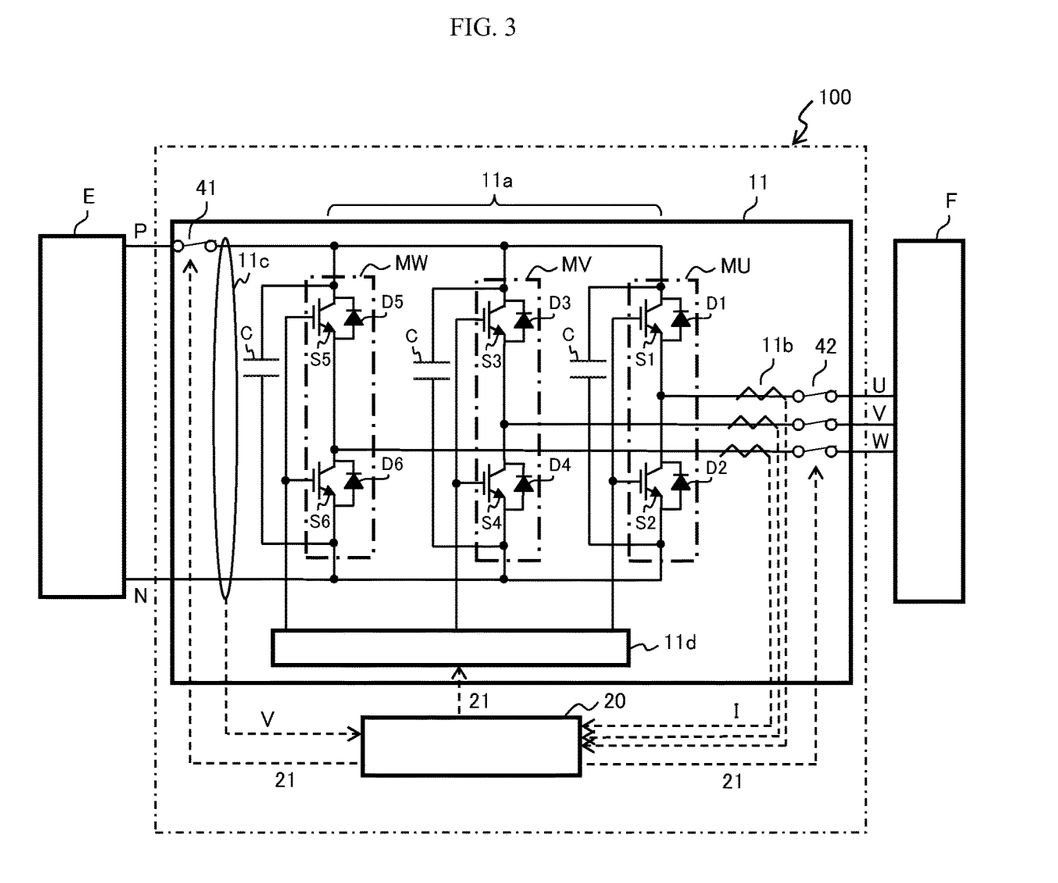
FIG. 3 is a circuit diagram of the power conversion apparatus according to the first example.

FIG. 3 is a circuit diagram of the power conversion apparatus according to the first example. Although one power conversion unit 11 is illustrated and the other power conversion unit 12 is not illustrated in FIG. 3, they have the same basic structure.

As illustrated in FIG. 3, the power conversion unit 11 includes a bridge circuit 11a, a current sensor 11b for detecting currents in an U-phase, a V-phase and a W-phase, a voltage sensor 11c for detecting a voltage across P and N, and a unit control circuit 11d for controlling the power conversion unit 11. The power conversion unit 11 also includes a smoothing capacitor C. Further, the power conversion unit 11 desirably includes an input-side switch 41 and an output-side switch 42.

The bridge circuit 11a is structured to have three power semiconductor modules MU, MV and MW constituting legs of the U-phase, the V-phase and the W-phase respectively, which are connected in parallel to each other. The three power semiconductor modules MU, MV, and MW constitute the power semiconductor module M1 in FIG. 1. The power semiconductor modules MU, MV and MW include diodes D1 to D6, and power semiconductor elements S1 to S6 constituted by switching elements such as insulated gate bipolar transistors (IGBTs) or metal oxide semiconductor field effect transistors (MOSFETs).

The control circuit in the first example includes, for example, the unit control circuit 11d provided in each of the power conversion units 11 and 12 for controlling the operation in the unit, and the parallel unit control circuit 20 for integrally controlling the plurality of power conversion units 11 and 12 connected in parallel to each other.

For example, the parallel unit control circuit 20 outputs a control signal 21 to each unit control circuit 11d. Based on the control signal 21, each unit control circuit 11d controls on/off of the power semiconductor elements S1 to S6. The parallel unit control circuit 20 detects an overcurrent and an overvoltage based on the currents I and the voltage V, and performs control for protection against the overcurrent and protection against the overvoltage. FIG. 3 illustrates an example where the parallel unit control circuit 20 performs control for protection against an overcurrent and protection against an overvoltage. However, the present invention is not limited thereto, and the unit control circuit 11d may receive inputs of detected values of the currents I and the voltage V, and the unit control circuit 11d may detect an overcurrent and an overvoltage and may perform control for protection against the overcurrent and for protection against the overvoltage. The parallel unit control circuit 20 controls the input-side switch 41 and the output-side switch 42 through control signals 21. Incidentally, the present invention is not limited thereto, and the parallel unit control circuit 20 may control the input-side switch 41 and the output-side switch 42 through the unit control circuit 11d.

Figure 4:
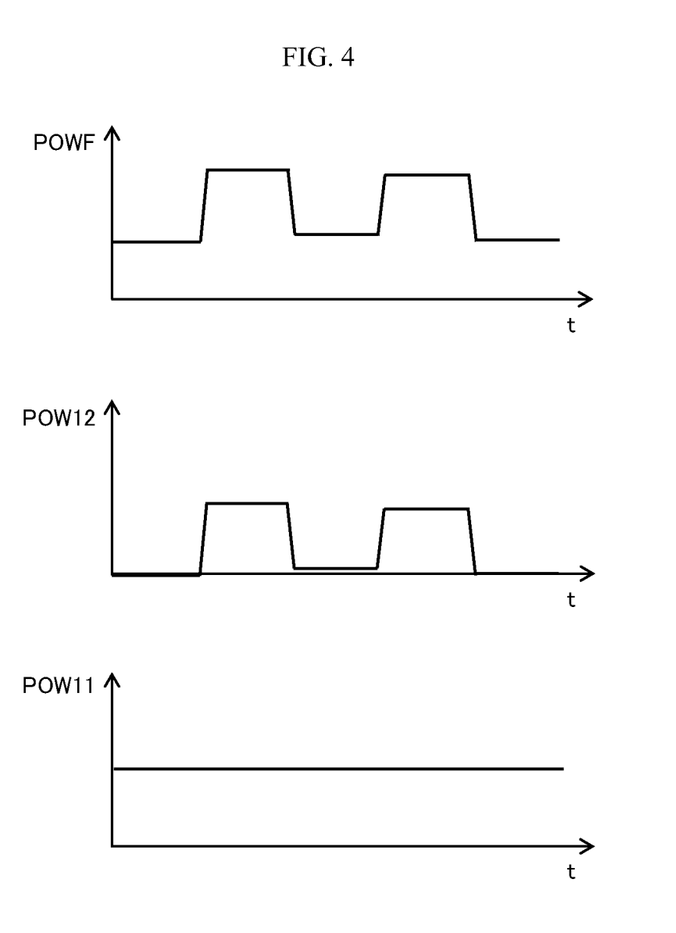
FIG. 4 is a view for explaining a method of controlling the power conversion apparatus according to the first example.

FIG. 4 is a view for explaining a method of controlling the power conversion apparatus according to the first example.

As described above, the control circuit in the power conversion apparatus 100 in the first example performs control such that the operating time period of the second power semiconductor module M2 is shorter than the operating time period of the first power semiconductor module M1. For attaining this, the operating time periods of both the power conversion units can be adjusted, as follows. For example, as illustrated in FIG. 4, while an output power POW11 of the power conversion unit 11 is kept constant, the power conversion unit 12 is stopped or an output power POW12 of the power conversion unit 12 is decreased when a load power POWF at a time t is small, and the output power POW12 of the power conversion unit 12 is increased when the load power POWF at the time t is large. However, the control method illustrated in FIG. 4 is merely an example, and other control methods may be also employed, provided that the power conversion apparatus can be controlled such that the operating time period of the second power semiconductor module M2 is shorter than the operating time period of the first power semiconductor module M1.

Second Example

Figure 5:
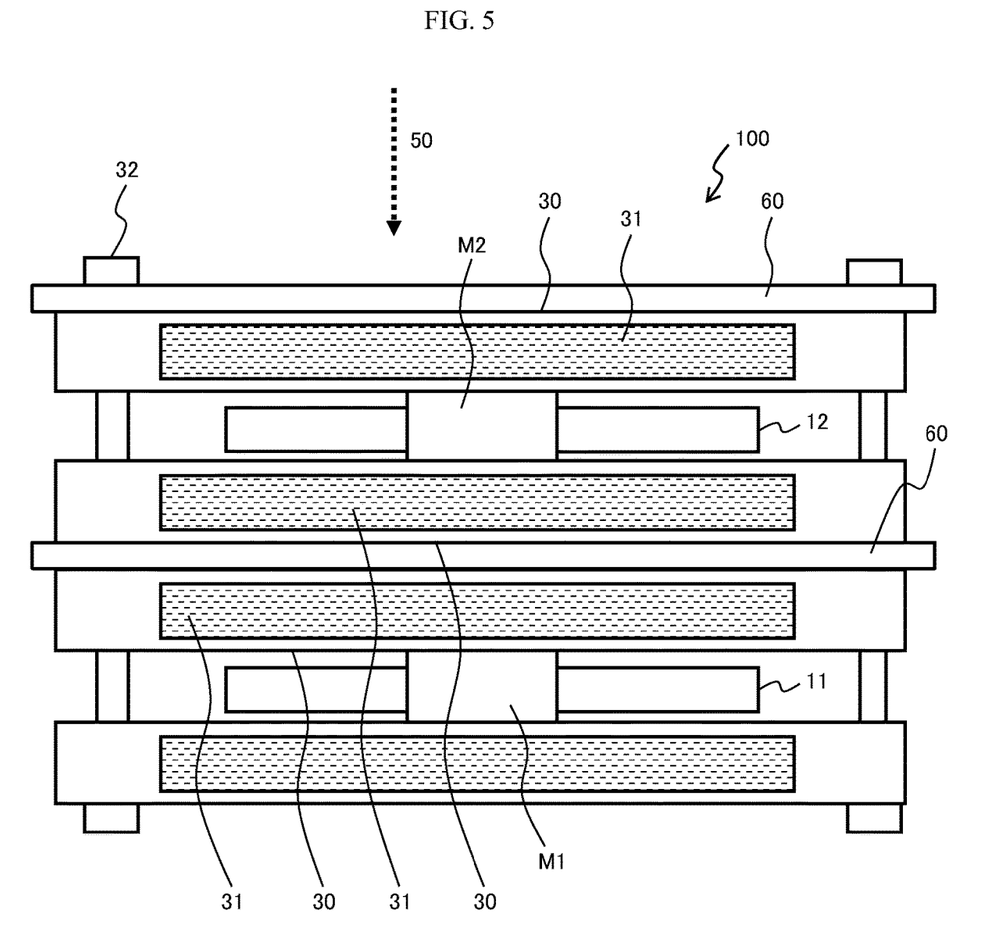
FIG. 5 is a cross-sectional view of a power conversion apparatus according to a second example.

FIG. 5 is a cross-sectional view of a power conversion apparatus according to a second example.

The second example is a modification of the first example. The second example is different from the first example in that interception sheets 60 are provided. The second example is the same as the first example on other points and, therefore, will be mainly described regarding its differences from the first example and will not be redundantly described.

The power conversion apparatus 100 in the second example includes cooling jackets 30 including a first cooling jacket for cooling an upper surface side of a first power semiconductor module M1, and a second cooling jacket for cooling a lower surface side of a second power semiconductor module M2. Further, the power conversion apparatus 100 in the second example includes an interception sheet 60 at least between the first cooling jacket and the second cooling jacket. Here, the interception sheet 60 is made of a rubber or a resin material which contains boron or hydrogen.

Since the interception sheet 60 contains boron or hydrogen, the interception sheet 60 can intercept cosmic rays, which can further reduce the dose of cosmic rays directed to the first power semiconductor module M1. Furthermore, since the interception sheet 60 is made of a rubber or a resin material, the interception sheet 60 can absorb a dimensional tolerance between the first cooling jacket and the second cooling jacket.

Further, as illustrated in FIG. 5, it is desirable that an interception sheet 60 is also disposed closer to the upper surface than the second power semiconductor module M2. This can further reduce the dose of cosmic rays directed to the second power semiconductor module M2.

Third Example

Figure 6:
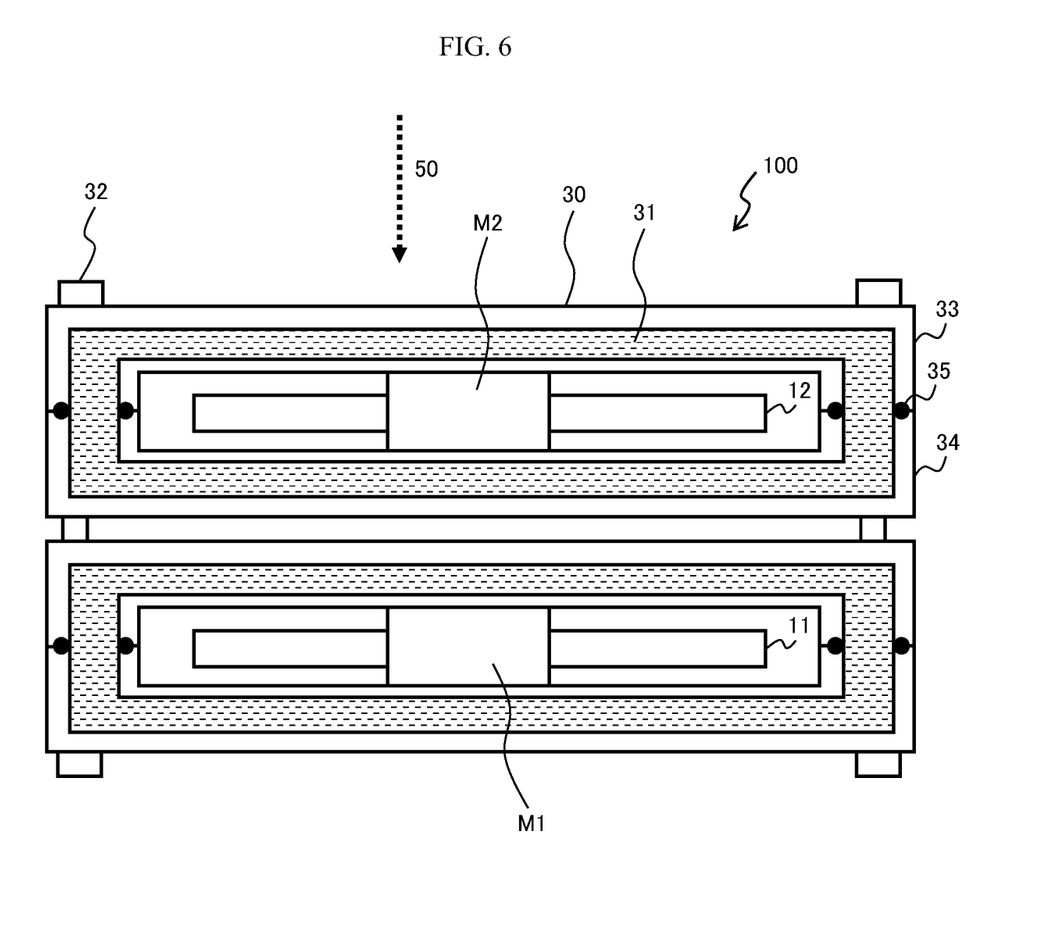
FIG. 6 is a cross-sectional view of a power conversion apparatus according to a third example.

FIG. 6 is a cross-sectional view of a power conversion apparatus according to a third example.

The third example is a modification of the first example. The third example is different from the first example, in terms of the shape of cooling jackets 30. The second example is the same as the first example on other points and, therefore, will be mainly described regarding its differences from the first example and will not be redundantly described.

The power conversion apparatus 100 in the third example includes cooling jackets 30 which also have refrigerant flow paths 31 beside a first power semiconductor module M1 and a second power semiconductor module M2. This makes it possible to intercept cosmic rays propagating in oblique directions and in lateral directions.

Incidentally, in the third example, the power conversion apparatus also has the same shape as that in FIG. 6 along a different cross section, and has the same shape as that in FIG. 6 at least along cross sections including the object to be cooled (the power semiconductor modules M1 and M2 in this case).

Here, FIG. 6 illustrates an example where the cooling jackets 30 are structured to have a combination of an upper cooling jacket 33 and a lower cooling jacket 34, and there is provided a seal member 35 for sealing the boundary between the upper cooling jacket 33 and the lower cooling jacket 34 in order to prevent leakage of the refrigerant. However, the present invention is not limited thereto, and may also employ other structures.

Fourth Example

Figure 7:
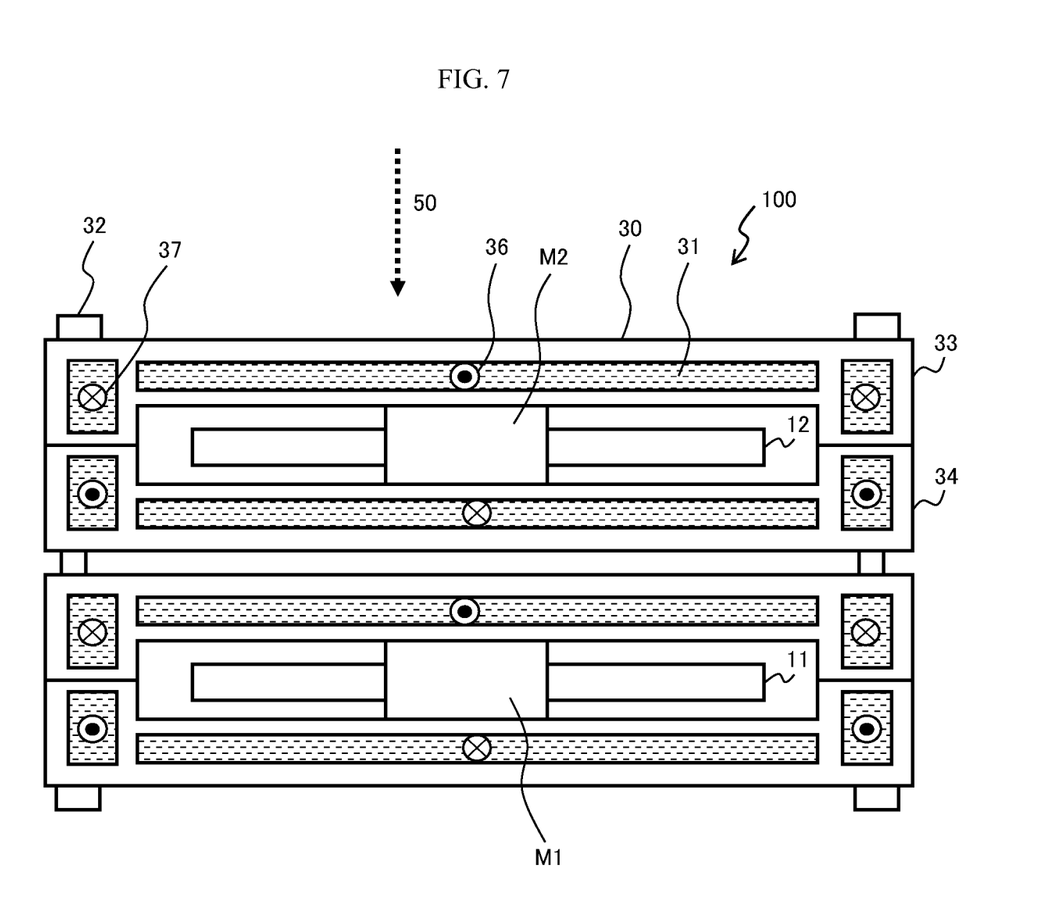
FIG. 7 is a cross-sectional view of a power conversion apparatus according to a fourth example.

FIG. 7 is a cross-sectional view of a power conversion apparatus according to a fourth example.

The fourth example is a modification of the third example. The fourth example is different from the third example, in terms of the shape of cooling jackets 30. The fourth example is the same as the third example on other points and, therefore, will be mainly described regarding its differences from the third example and will not be redundantly described.

The power conversion apparatus 100 in the fourth example is the same as that in the third example, in that the cooling jackets 30 includes an upper cooling jacket 33 disposed near an upper surface of the object to be cooled (in this case, power semiconductor modules M1 and M2), and a lower cooling jacket 34 connected to the upper cooling jacket 33 and disposed near a lower surface of the object to be cooled.

Here, the power conversion apparatus 100 in the fourth example is structured as follows. That is, when one of an inflow path 36 and a return path 37 is defined as a path in a first direction, and the other one of the inflow path 36 and the return path 37 is defined as a path in a second direction, the upper cooling jacket 33 includes a refrigerant flow path 31 disposed near the upper surface of the object to be cooled, as a path in the first direction (an inflow path 36 in FIG. 7), and the upper cooling jacket 33 further includes a refrigerant flow path 31 disposed beside the object to be cooled, as a path in the second direction (a return path 37 in FIG. 7). Further, the lower cooling jacket 34 includes a refrigerant flow path 31 disposed beside the object to be cooled, as a path in the first direction (an inflow path 36 in FIG. 7), and the lower cooling jacket 34 further includes a refrigerant flow path 31 disposed near the lower surface of the object to be cooled, as a path in the second direction (a return path 37 in FIG. 7).

The power conversion apparatus has the same shape as that in FIG. 6, for example, along a cross section at a different position from that in FIG. 7, so that the refrigerant flow paths 31 in the upper cooling jacket 33 and the refrigerant flow paths 31 in the lower cooling jacket 34 are connected to each other.

By doing as in the power conversion apparatus 100 in the fourth example, it is possible to intercept cosmic rays propagating in oblique directions and in lateral directions, similarly to in the third example, and it is also possible to reduce the number of connection portions for connecting the refrigerant flow paths 31 in the upper cooling jacket 33 and the refrigerant flow paths 31 in the lower cooling jacket 34 to each other, thereby reducing the number of positions where seal members 35 are provided, in comparison with in the third example.

Although the examples of the present invention have been described above, the present invention is not limited to the structures described in the examples, and various changes can be made within the scope of the technical concept of the present invention. In addition, some or all of the structures described in the respective examples may be adopted in combination.

What is claimed is:

1. A power conversion apparatus comprising:
    a first power semiconductor module,
    a second power semiconductor module,
    a control circuit adapted to drive the first power semiconductor module and the second power semiconductor module, and
    a liquid-cooling type cooling jacket, wherein
        the second power semiconductor module is disposed closer to an upper surface in a gravity direction than the first power semiconductor module is,
        the cooling jacket includes a refrigerant containing hydrogen molecules and a flow path for the refrigerant at least between the first power semiconductor module and the second power semiconductor module, and
        the control circuit performs control such that an operating time period of the second power semiconductor module is shorter than an operating time period of the first power semiconductor module.

2. The power conversion apparatus according to claim 1, wherein the refrigerant contains water molecules.

3. The power conversion apparatus according to claim 1, wherein the cooling jacket also has a flow path for the refrigerant near an upper surface of the second power semiconductor module.

4. The power conversion apparatus according to claim 1, comprising: a switch adapted to be controlled to be in an open state for preventing a voltage from being applied to a power semiconductor module being stopped, out of the first power semiconductor module and the second power semiconductor module.

5. The power conversion apparatus according to claim 1, wherein
    the cooling jacket includes a first cooling jacket for cooling an upper surface side of the first power semiconductor module, and a second cooling jacket for cooling a lower surface side of the second power semiconductor module,
    there is disposed an interception sheet at least between the first cooling jacket and the second cooling jacket, and
    the interception sheet is made of a rubber or a resin material which contains boron or hydrogen.

6. The power conversion apparatus according to claim 5, wherein the interception sheet is also disposed closer to the upper surface than the second power semiconductor module is.

7. The power conversion apparatus according to claim 1, wherein the cooling jacket further has a flow path for the refrigerant, beside the first power semiconductor module and the second power semiconductor module.

8. The power conversion apparatus according to claim 7, wherein
    the cooling jacket includes an upper cooling jacket disposed near an upper surface of an object to be cooled, and a lower cooling jacket connected to the upper cooling jacket and disposed near a lower surface of the object to be cooled,
    when one of an inflow path and a return path is defined as a path in a first direction, and another one of the inflow path and the return path is defined as a path in a second direction, the upper cooling jacket includes a flow path for the refrigerant which is disposed near the upper surface of the object to be cooled, as a path in the first direction, and the upper cooling jacket further includes a flow path for the refrigerant which is disposed beside the object to be cooled, as a path in the second direction, and
    the lower cooling jacket includes a flow path for the refrigerant which is disposed beside the object to be cooled, as a path in the first direction, and the lower cooling jacket further includes a flow path for the refrigerant which is disposed near the lower surface of the object to be cooled, as a path in the second direction.

* * * * *